US007843262B2

(12) United States Patent
Takenaka

(10) Patent No.: US 7,843,262 B2
(45) Date of Patent: Nov. 30, 2010

(54) HIGH EFFICIENCY POWER AMPLIFIER

(75) Inventor: Isao Takenaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 10 days.

(21) Appl. No.: 12/351,876

(22) Filed: Jan. 12, 2009

(65) Prior Publication Data

US 2009/0179703 A1 Jul. 16, 2009

(30) Foreign Application Priority Data

Jan. 15, 2008 (JP) ............................ 2008-006086

(51) Int. Cl.
*H03G 3/20* (2006.01)

(52) U.S. Cl. .................................. 330/136; 330/124 R

(58) Field of Classification Search ................ 330/136, 330/124 R, 295
See application file for complete search history.

(56) References Cited

U.S. PATENT DOCUMENTS 5,757,229 A * 5/1998 Mitzlaff .................. 330/124 R
7,345,535 B2 * 3/2008 Kwon et al. ............ 330/124 R
7,352,239 B2 * 4/2008 Lee et al. ................ 330/124 R
2009/0058532 A1 * 3/2009 Kikkawa et al. ............ 330/295

FOREIGN PATENT DOCUMENTS

JP 2007-81800 3/2007

OTHER PUBLICATIONS

Donald F. Kimball et al., "High-Efficiency Envelope-Tracking W-CDMA Base Station Amplifier Using GaN HFETs", IEEE Transactions on Microwave Theory and Techniques, vol. 54, No. 11, Nov. 2006, pp. 3848-3856.
I. Takenaka et al., "A 240W Doherty GaAs Power FET Amplifier With High Efficiency and Low Distortion for W-CDMA Base Stations", 2004 IEEE MTT-S Int. Microwave Symp. Dig., pp. 525-528.

* cited by examiner

*Primary Examiner*—Henry K Choe
(74) *Attorney, Agent, or Firm*—Young & Thompson

(57) ABSTRACT

Disclosed a power amplifier including a main amplifier with class bias AB and a peak amplifier with class C bias. A quarter-wave length transmission line having a length equal to one-fourth of the wave-length of a fundamental frequency is connected to an output side of the peak amplifier. Outputs of the main amplifier and the peak amplifier are combined. An envelope amplifier that modulates the drain bias voltage in accordance with an envelope of the modulation wave input signal and an envelope detector are provided as a drain-bias circuit for the main amplifier (FIG. 1).

8 Claims, 12 Drawing Sheets

1
2
Delay
6
4
Envelope Detector
5
Envelope Amp.
7
11
0°
Hyb
90°
8
3
Peak Amp.(Class-C)
Main Amp.(Class-AB)
9
λ/4
10
Low → High
Vd Low → High Efficiency (%)
90.0
80.0
70.0
60.0
50.0
40.0
30.0
20.0
10.0
0.0
0.00
10.00
20.00
30.00
40.00
Pout (dBm)
Average Level
Peak Output Modulation Wave Input Signal
Average Power
Envelope
Peak Power
1
Envelope Detector
4
Delay
6
5
Envelope Amp.
Main Amp.
3
7
Vd (Drain Bias)
2

Doherty network
Main Amp. (class-AB)
Peak Amp. (class-C)
λ/4
RL/2
RL
2*RL → RL
A
1
2
3
8
13
14
15
16

26
22
25
Class AB Bias
MATCH-ING
MATCH-ING
RF Input
24
λ/4
21
Main Amplifier
Class B Bias
MATCH-ING
MATCH-ING
RF Output
Auxiliary Amplifier
23

Pout Match
@Vd2
Eff. Match
@Vd1
500
200
100
50
25
100
50
25
-100
-50
-25
0
∞

Efficiency (%)
90.0
80.0
70.0
60.0
50.0
40.0
30.0
20.0
10.0
0.0
0.00
10.00
20.00
30.00
40.00
Pout (dBm)
Average Level
Peak Output
8V
12V
18V
28V
38V
48V Gain (dB)
20.0
15.0
10.0
5.0
0.0
-5.0
-10.0
-15.0
-20.0
1.50
2.00
2.50
Frequency (GHz)
8V
12V
16V
20V
24V
28V

HIGH EFFICIENCY POWER AMPLIFIER

REFERENCE TO RELATED APPLICATION

This application is based upon and claims the benefit of the priority of Japanese patent application No. 2008-006086 filed on Jan. 15, 2008, the disclosure of which is incorporated herein in its entirety by reference thereto.

FIELD OF THE INVENTION

This invention relates to a power amplifier and, more particularly, to an amplifier with which a high efficiency characteristic may be achieved even under an operating state with a large back-off from a saturation output.

DESCRIPTION OF RELATED ART

In a large capacity and high speed mobile communication system, a modulation wave signal having a high peak factor (peak power to average power ratio) is used, as in W-CDMA of the third-generation mobile communication system. With the amplifier used in such system, in which a high peak power is to be amplified, it is necessary to provide a sufficient back-off from the saturation output, thus presenting a problem that the amplifier efficiency is lowered.

A large variety of amplifiers have so far been proposed for improving the efficiency in an operating range with a large back-off.

The drain bias of a drain-bias modulation amplifier, operating in the vicinity of the saturation output, is modulated with being tuned to a modulation wave input signal. This yields a peak power as well as a high efficiency operation.

Referring to FIG. 4, a drain-bias modulation amplifier, shown in Non-Patent Document 1, includes, in a drain-bias circuit 7 of a main amplifier 3, an envelope amplifier 5 and an envelope detector 4. The envelope amplifier 5 modulates the drain bias (Vd) in accordance with an envelope of the modulation wave input signal. By adjusting a delay line 6, provided on the input side of the main amplifier 3, the drain bias may be modulated with being tuned to the modulation wave input signal.

With the above configuration, the drain-bias modulation amplifier of FIG. 4 operates with high efficiency at low voltage for an average power level of the modulation wave signal, while operating at high voltage for a peak power level of the modulation wave signal to amplify a peak signal.

As another example of the high efficiency amplifier, Non-Patent Document 2 discloses a Doherty amplifier shown in FIG. 5. With the Doherty amplifier, an output of a main amplifier (Main Amp.) 3 biased for class AB operation, and an output of a peak amplifier (Peak Amp.) 8 biased for class C operation, are combined by a quarter-wave length (λ/4) transmission line 15 (Doherty network) with a wavelength one-fourth the fundamental frequency. The quarter-wave length transmission line 15 is connected to an output side of the main amplifier 3.

The Doherty amplifier operates by taking advantage of the impedance transformation by the quarter-wave length transmission line 15. That is, at a low input level, with the peak amplifier 8 in OFF-state, only the main amplifier 3 operated at high efficiency in a load state in which load impedance is twice the load impedance RL (2*RL), with the back-off being low. At a high input level, the peak amplifier 8 is turned on, while the load on the main amplifier 3 is decreased, that is, changed from 2*RL to RL. Moreover, the peak amplifier 8 earns the peak power of the amplifier as a whole. Thus, a high efficiency operation in the high back-off region may be enabled as a high peak power is maintained.

FIG. 6 shows comparison of the output back-off to efficiency characteristics of a drain-bias modulation amplifier, a Doherty amplifier and a class-B amplifier. Theoretically, the drain-bias modulation amplifier and the Doherty amplifier may be improved over the class-B amplifier in the efficiency of the output region with approximately 6 dB back-off from the saturation output.

Thus, to improve the power efficiency of an amplifier appreciably without deteriorating the system signal quality, such an amplifier exhibiting both a high efficiency characteristic and a high peak power characteristic in combination in its operation level has been desired.

With a view to achieving an operation of higher efficiency at an operating level of a large back-off from the saturation output, there is shown in Patent Document 1 (Example 2) an example of a Doherty amplifier provided with an input level detector that detects an input level. The power supply voltages of a main amplifier and a peak amplifier are controlled in dependence upon an output signal of an input level detector. The peak amplifier is termed in Patent Document 1 as an auxiliary amplifier.

FIG. 7 shows a circuit configuration disclosed in Example 2 (FIG. 4) of Patent Document 1. In the configuration of FIG. 7, there is shown a Doherty amplifier made up of a main amplifier 22 biased for class AB operation, an auxiliary amplifier (peak amplifier) 23 biased for class B operation, and a quarter-wave length transmission line (impedance transformation unit) 24 connected to the main amplifier 22. The outputs of the two amplifiers are combined together by the quarter-wave length transmission line. The power supply voltages of the main amplifier 22 and the auxiliary amplifier 23 are controlled by a voltage controller 26 in response to an output signal of an input level detector 25. In case of a low input level, the power supply voltage is lowered to maintain a high operating efficiency and, in case of a high input level, the power supply voltage is raised to increase the maximum output power of the amplifier in its entirety, thereby assuring a high efficiency at the operating point.

[Non-Patent Document 1] Donald F. Kimball et al., "High-Efficiency Envelope-Tracking W-CDMA Base-Station Amplifier Using GaN HFETs", IEEE Trans. Microw. Theory Tech. vol. 54, No. 11, November 2006

[Non-Patent Document 2] I. Takenaka et al., "A 240 W Doherty GaAs power FET amplifier with high efficiency and low distortion for W-CDMA base stations", 2004 IEEE MTT-S Int. Microwave Symp. Dig., pp. 525-528

[Patent Document 1] JP Patent Kokai JP-A-2007-81899 (FIG. 4)

SUMMARY OF THE DISCLOSURE

The following analysis of the related art is given by the present invention.

If, in the above-described Doherty amplifier, a drain bias modulation circuit is provided on the main amplifier side, and the power supply is modulated with being tuned to an input signal, there is presented a problem that the efficiency at an average operating level is lowered, and a saturation output on the main amplifier is also lowered. In short, it has been found that a high efficiency operation and a high peal power cannot be achieved in combination.

FIG. 8 shows an example of drain voltage dependence of a load-pull characteristic of a field effect transistor used in an amplifier (Vds=12V, 48V). Referring to FIG. 8, the load condition for the maximum efficiency for a low drain voltage (Vd1=12V) (Eff. Match) differs from the load condition for the maximum output for a high drain voltage (Vd2=48V) (Pout match) insofar as actual devices are concerned.

Due to drain voltage dependence of reactance components proper to a transistor, the optimum load impedance for a low drain voltage becomes lower than that for a high drain voltage.

FIG. 9 shows the drain voltage dependence of the output (Pout)-efficiency characteristic in case of setting an output side load condition to an optimum load impedance for a high drain voltage (Vds=8V to 48V). FIG. 10 shows drain voltage dependence of the output-efficiency characteristic in case of setting the output side load condition to an optimum load impedance for a low drain voltage.

A voltage-dependent characteristic of the envelope of the output-efficiency characteristic may be obtained by modulating the drain voltage in proportion to the amplitude of the modulation wave input signal.

FIG. 11 shows an example of the probability distribution of amplitude components of a W-CDMA modulation wave signal.

The maximum instantaneous peak power has a wave crest value which is high and is on the order of 10 dB from the average power having the highest distribution probability.

If the load condition on the output side of the amplifier transistor is set to the optimum load impedance for a high drain voltage, the efficiency at an average output level (28 dBm) with a back-off of approximately 10 dB from the peak output of 38 dBm is low and is on the order of 60% against the maximum efficiency of 73% at a peak output.

If conversely the load condition on the output side of the amplifier transistor is set to the optimum load impedance for the low drain voltage, the efficiency at a high average output level of 73% may be obtained, as may be seen from FIG. 10. However, the peak output is 36 dBm, which is lower by as much as 2 dB than if the load condition is set to the optimum load impedance at a high drain voltage.

That is, there is presented a problem that, if the output side load condition is set to the maximum output condition for the high voltage operation, the efficiency at the average operating level is lowered, and that, if the output side load condition is set to the maximum output condition for the low voltage operation, the peak power characteristic is lowered.

It is now assumed that the drain-bias modulation amplifier, performing the operation as described above, is applied to a Doherty amplifier as shown in Example 2 of Patent Document 1 (see FIG. 7 hereof). In such case, since the peak amplifier is turned on with increase in the input level, the load impedance of the main amplifier is changed from high impedance to low impedance due to the impedance transformation operation of the quarter-wave length transmission line.

Thus, even though the optimum load impedance during the low drain voltage operation for the low input level is on the low impedance side and the optimum load impedance during the high drain voltage operation for the high input level is on the high impedance side, the operation of the amplifier becomes the transformation of two opposite load impedance states.

That is, in the Doherty amplifier, having such drain bias modulation configuration, in which the tendency of the drain voltage dependence of the optimum load impedance of the device is not in keeping with the amplifier operation, even when the drain voltage is increased with increase in the output signal level. It is thus difficult to achieve in combination high efficiency characteristic and the high peak power characteristic at the operating point level.

In addition, in such Doherty amplifier, since the drain bias modulation circuit is provided on the side of the peak amplifier as well, marked gain reduction takes place due to a resonance point generated in an operating range of the amplifier, with the result that an optimum amplifier characteristic may not be obtained.

FIG. 12 shows a gain-frequency characteristic of a Doherty amplifier in case of changing drain voltages of the main and peak amplifiers. With decrease in the drain voltage, the resonant point shifts into the operating range of from 1.9 to 2.05 GHz, thus appreciably decreasing the gain.

The reason may be such that, since the output impedance of the class C transistor of the peak amplifier exhibits marked drain voltage dependence which is higher than that of the class AB transistor of the main amplifier, pass loss increases under the influence of the impedance on the side of the peak amplifier when the drain voltage is decreased at an output combining point (point A of FIG. 5) between the main amplifier and the peak amplifier.

Inherently, the impedance looking from the output combining point of the main and peak amplifiers (point A of FIG. 5) towards the peak amplifier is desirably an open state. However, when the drain voltage is changed, the output impedance of the peak amplifier is changed and deviated from the open state, when the drain voltage is changed, with the result that output power leakage occurs from the main amplifier, thereby causing loss.

That is, if, in the Doherty amplifier, the drain bias of the peak amplifier is modulated, the gain characteristic is lowered under the effect of bias dependence of the class C transistor in the peak amplifier.

The present invention seeks to solve one or more of the above problems.

In one aspect of the present invention, there is provided a power amplifier comprising a main amplifier, a peak amplifier, and a quarter-wave length (λ/4) transmission line connected to an output of the peak amplifier. The quarter-wave length transmission line has a length which is equal to one-fourth of the wave-length (λ) of a fundamental frequency. The main amplifier includes a drain-bias circuit. The drain-bias circuit includes: an envelope detector that receives a modulation wave input signal to detect an envelope thereof; and an envelope amplifier that modulates a drain bias of the main amplifier in accordance with the envelope of the modulation wave input signal.

According to the present invention, there is also provided a power amplifier comprising: a main amplifier; a peak amplifier, an input distributor for distributing the power of a modulation wave input signal to the main amplifier and to the peak amplifier; a quarter wave line connected to an output of the peak amplifier, and a bias circuit that affords a bias voltage to the main amplifier. The bias circuit includes an envelope detection circuit that receives the modulation wave input signal to detect an envelope thereof, and an envelope amplifier that amplifies an output of the envelope detection circuit to deliver a bias voltage to the main amplifier. An output of the quarter wave line and an output of the main amplifier are combined together and output.

According to the present invention, the peak amplifier operates at a constant drain voltage and is turned on only at a peak power level of the modulation wave signal to amplify the signal. The main amplifier operates with a low voltage at an average level of the modulation wave input signal, while operating with a high voltage at an instantaneous peak level of the modulation wave input signal.

According to the present invention, the main amplifier allows for a load variation from a low impedance condition to a high impedance condition with increase in the input level by the impedance transforming action of the quarter-wave length transmission line. The low impedance condition is such a condition that affords the maximum efficiency for the low voltage operation at an average level of the modulation wave input signal. The high impedance condition is such a condition that affords the maximum output for the high voltage operation at a peak output.

According to the present invention, the high efficiency characteristic and the high peak power characteristic may be obtained in combination at the operating level of the amplifier.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES OF THE INVENTION

Figure 1:
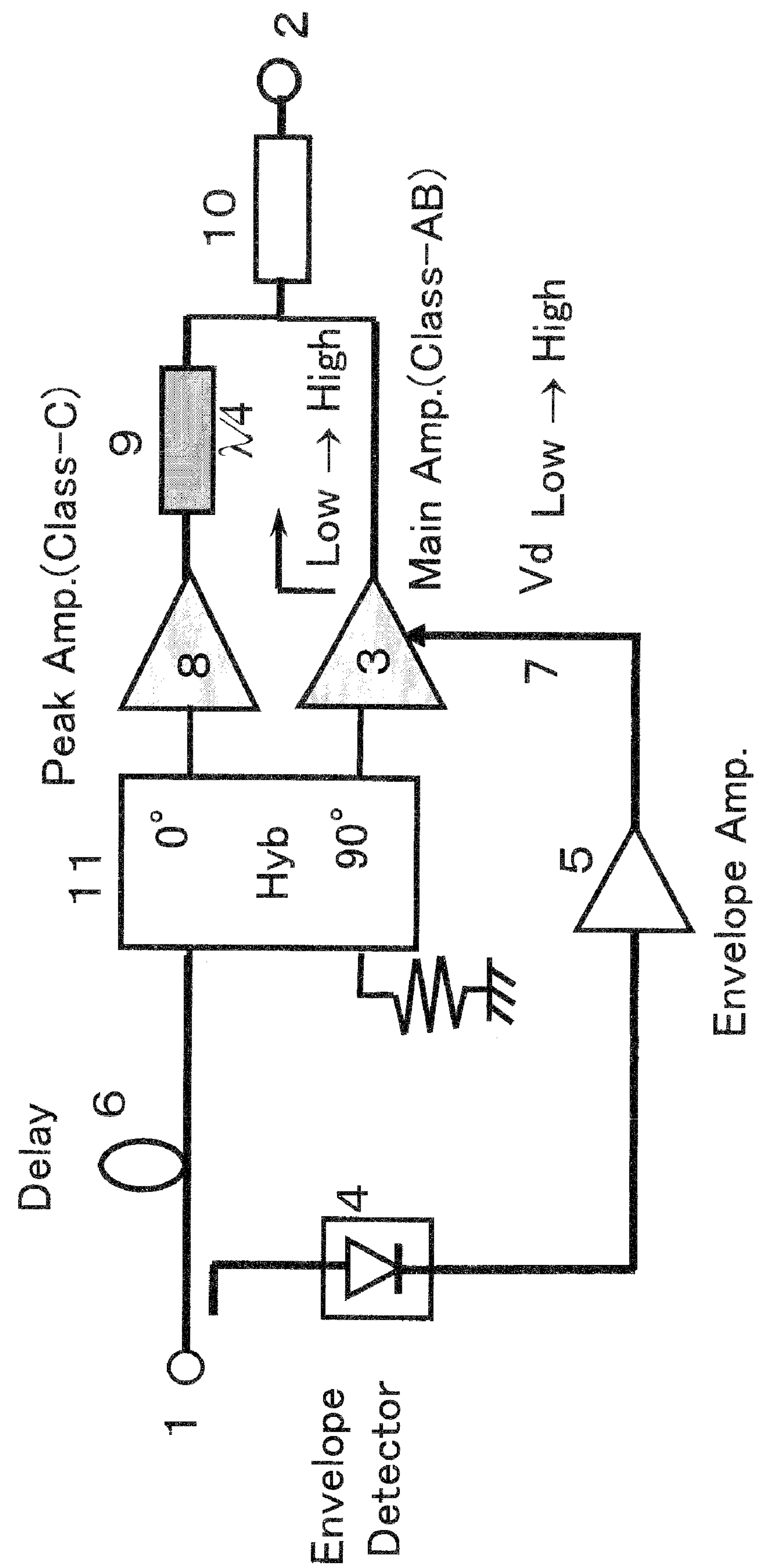
FIG. 1 is a circuit diagram showing a configuration of a power amplifier according to an Example of the present invention.

According to the present invention, an output of a main amplifier (3) biased for class AB operation and an output of a peak amplifier (8) biased for class C operation are combined by a quarter-wave length (λ/4) transmission line (9) of a frequency equal to one-fourth the fundamental frequency. This quarter-wave length transmission line is connected to an output side of the peak amplifier (8). The main amplifier (3) has a drain-bias circuit (7) which is provided with an envelope amplifier (5) and an envelope detection circuit (4). The envelope amplifier (5) modulates a drain bias voltage in accordance with an envelope of the modulation wave input signal.

The main amplifier (3) allows for a load variation from a low impedance condition to a high impedance condition, by the impedance transforming action of the quarter-wave length transmission line (9), provided at an output side of the peak amplifier (8), with increase in the input level. The low impedance condition is such a condition that affords the maximum efficiency for the low voltage operation at an average output level. The high impedance condition is such a condition that affords the maximum output for the high voltage operation at a peak output.

Since the bias of the peak amplifier (8) is fixed, the gain characteristic is not affected by the impedance of the peak amplifier (8). According to the present invention, a high efficiency characteristic and a high peak power characteristic may be achieved in combination at the operating point level. The reason is that the tendency of the drain voltage dependence of the optimum load impedance of the device is in keeping with the amplifier operation. The present invention will now be described with reference to Examples.

FIG. 1 depicts a circuit configuration of a power amplifier according to the present invention. A main amplifier 3 biased for class AB operation and a peak amplifier 8 biased for class C operation are connected to a quarter-wave length (λ/4) transmission line 9 provided on an output side of the peak amplifier 8. The quarter-wave length transmission line 9 has a length equal to one-fourth of the wave-length (λ) of the fundamental frequency.

A drain-bias circuit 7 for the main amplifier 3 includes an envelope amplifier 5 and an envelope detector 4. The envelope amplifier modulates the drain bias of the main amplifier 3 in accordance with an envelope of a modulation wave input signal. The envelope detector 4 includes a diode.

The modulation wave input signal is delayed by a delay line 6 and supplied to an input distributor 11. The input distributor 11 distributes the power of the modulation wave input signal to the main amplifier 3 and the peak amplifier.

The input distributor 11 may be a quarter-wave length transmission line as that provided in the Doherty amplifier.

The peak amplifier 8 operates at a constant drain voltage and is turned on only at a peak power level of the modulation wave signal to amplify a signal. The detailed circuit configuration is shown in Non-Patent Document 1.

By the drain-bias circuit 7, the main amplifier 3 is operated with a low voltage at an average level of the modulation wave signal and is operated with a high voltage at an instantaneous peak level of the modulation wave signal, respectively.

Figure 5:
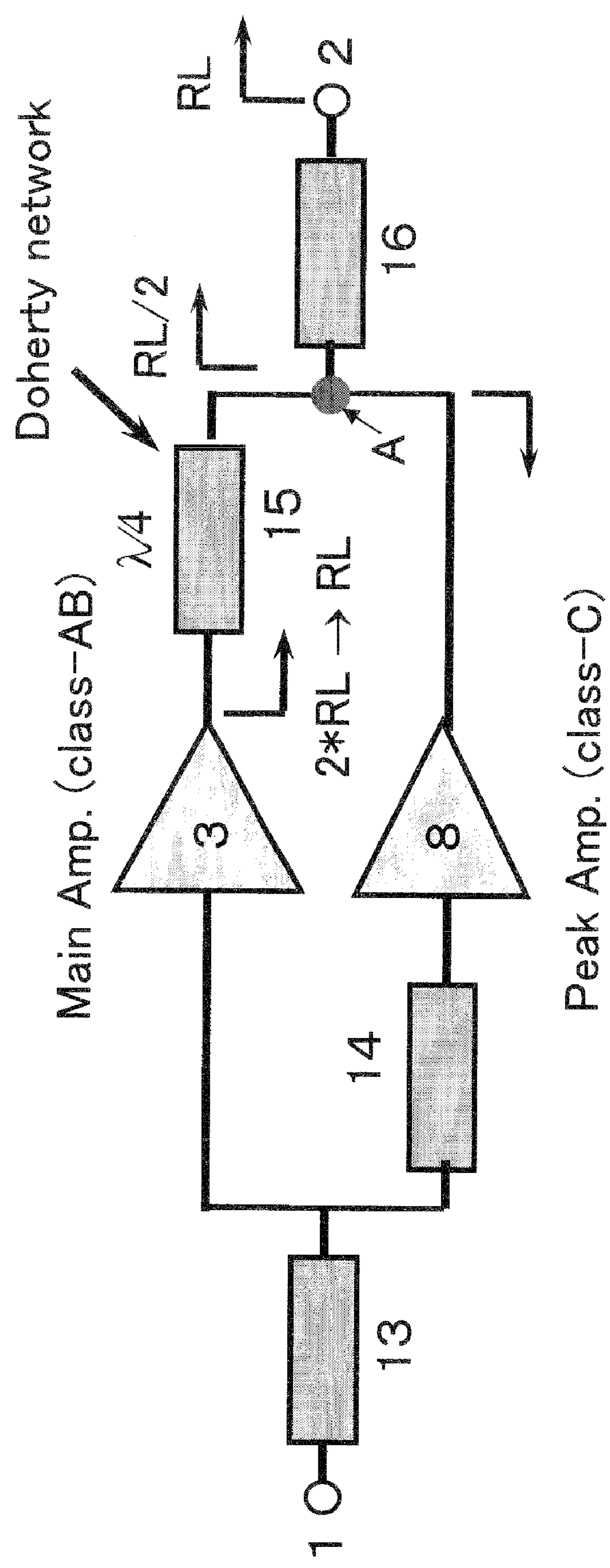
FIG. 5 is a circuit diagram showing a configuration of a conventional Doherty amplifier of Non-Patent Document 2.
Figure 6:
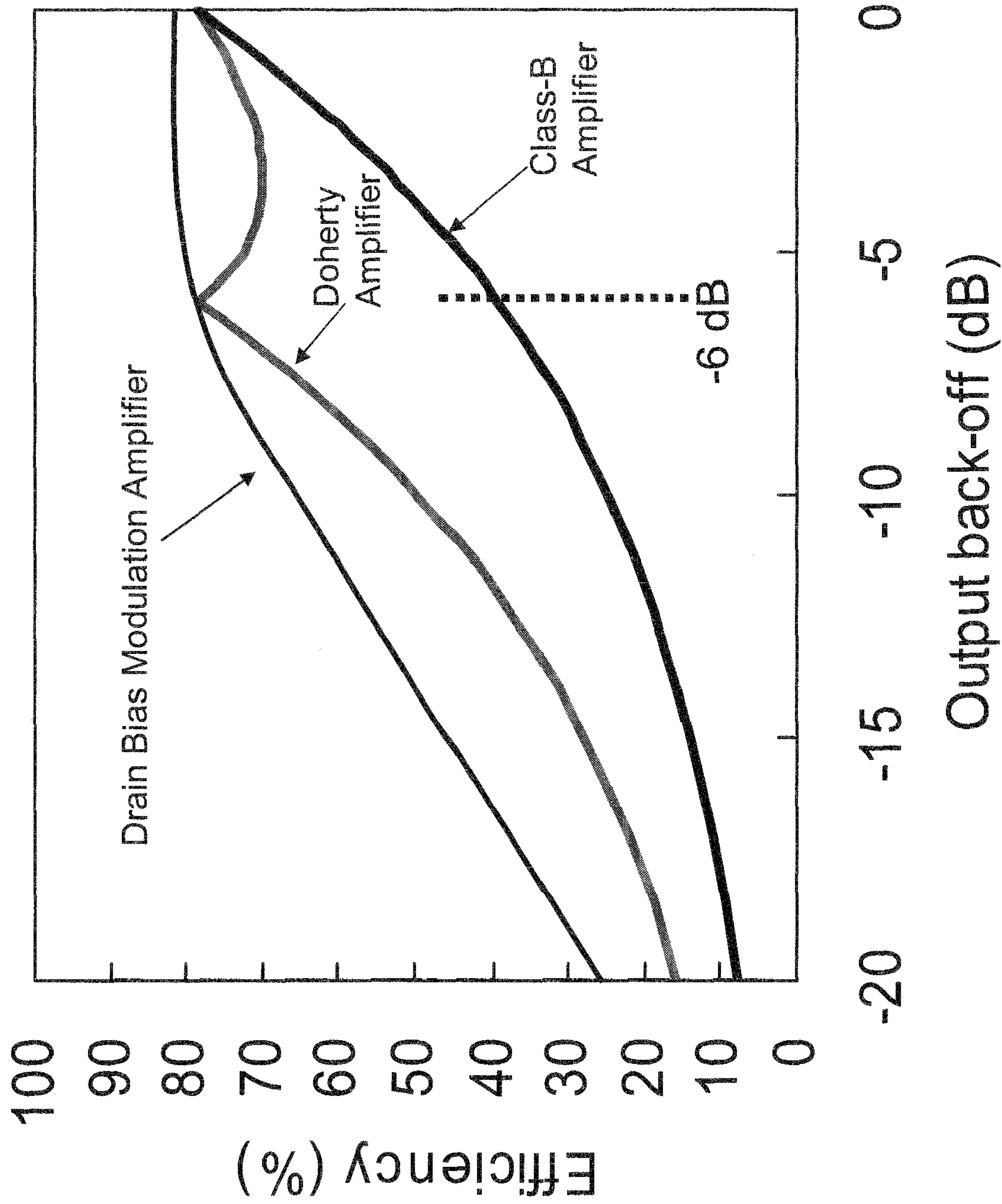
FIG. 6 is a graph for comparison of output back-off to efficiency characteristics of a drain-bias modulation amplifier, a Doherty amplifier and a class-B amplifier.
Figure 7:
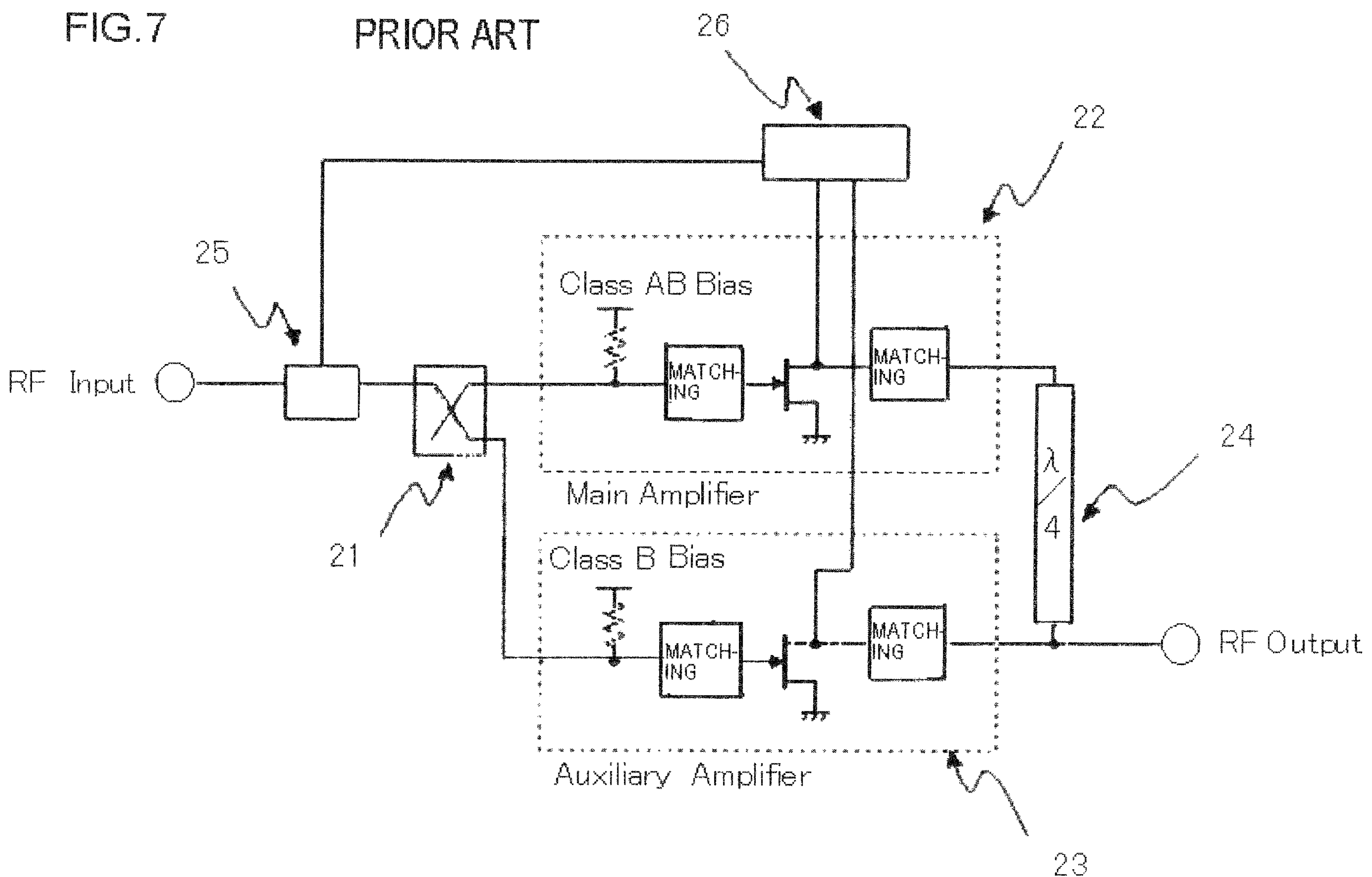
FIG. 7 is a circuit diagram showing a configuration of an amplifier shown in Example 2 of Patent Document 1.
Figure 8:
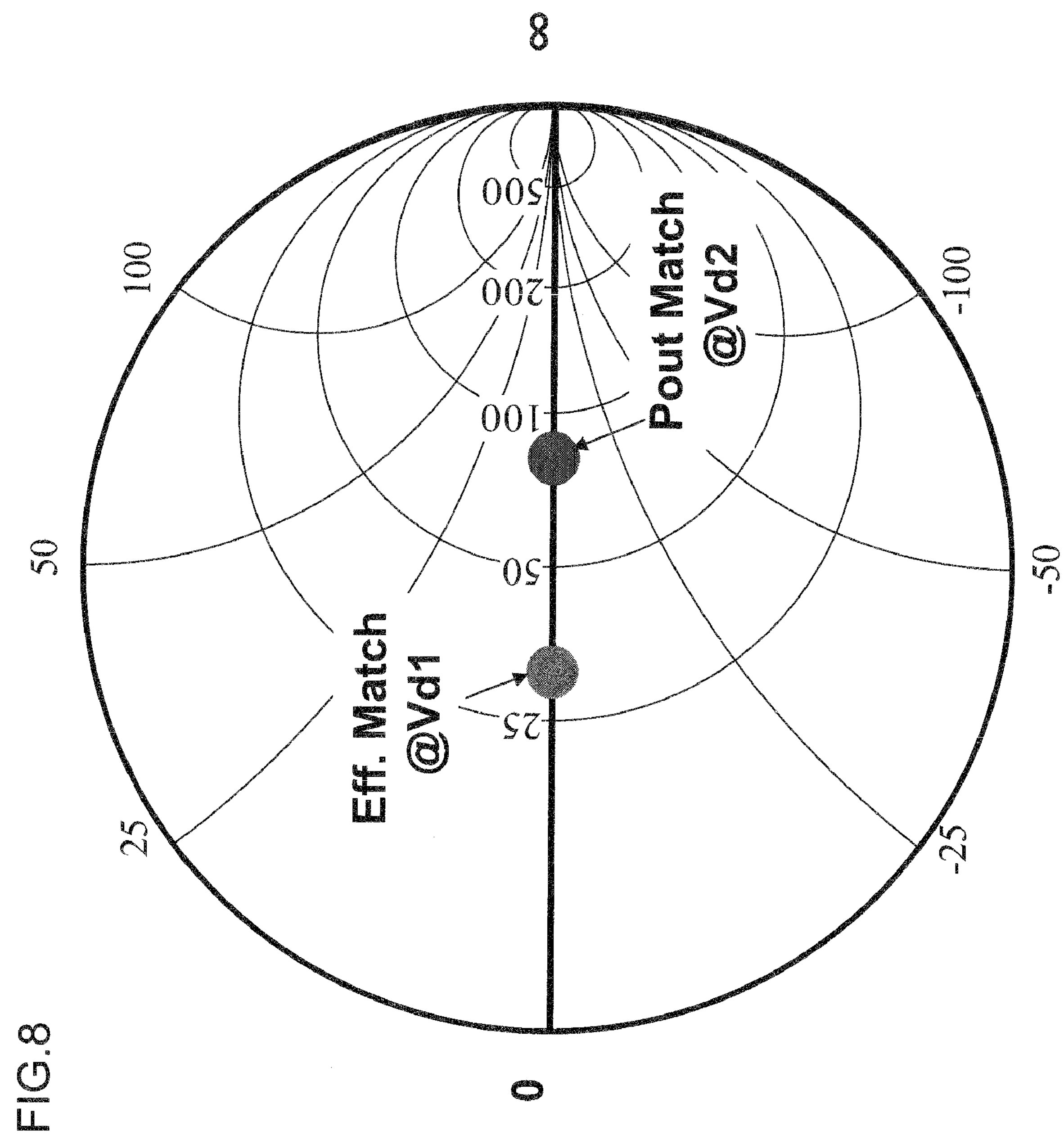
FIG. 8 is a diagram showing drain voltage dependence of a load-pull characteristic of a field-effect transistor.

The quarter-wave length transmission line 9 is provided on the side of the peak amplifier 8 in a manner contrary to the case of the Doherty amplifier explained above as a related art technique (see FIG. 5, for instance). That is, by the impedance transforming action of the quarter-wave length transmission line 9, provided on the side of the peak amplifier, the main amplifier 3, allows for a load variation from a low impedance condition to a high impedance condition with increase in the input level. The low impedance condition is a condition that affords the maximum efficiency for the low voltage operation at an average level of the modulation wave input signal, whilst the high impedance condition is such a condition that affords the maximum output for the high voltage operation at a peak output.

Since the bias of the peak amplifier 8 is fixed, the gain characteristic is not affected by the impedance of the peak amplifier 8.

Thus, even if, in the amplifier of the present invention, the drain voltage is increased with increase of the input signal level, a high efficiency characteristic and a high peak power characteristic may be achieved in combination at an operating point level because the tendency of the drain voltage dependence of the optimum load impedance of the device may be brought into coincidence with the amplifier operation.

In the present Example, an output of the main amplifier 3 biased for class AB operation and an output of the peak amplifier biased for class C operation are combined together by the quarter-wave length transmission line 9 provided on the output side of the peak amplifier 8. The quarter-wave length transmission line is of a length equal to one-fourth of the wave-length of the fundamental frequency. Further, the drain bias voltage of the main amplifier 3 is modulated in accordance with an envelope of the modulation wave input signal. It is thus possible to realize optimum load variations that follow an input signal level in keeping with drain voltage dependence of the optimum load condition in the device.

In this manner, the operation efficiency of an amplifier may drastically be improved as the high peak power characteristic is maintained.

Figure 2:
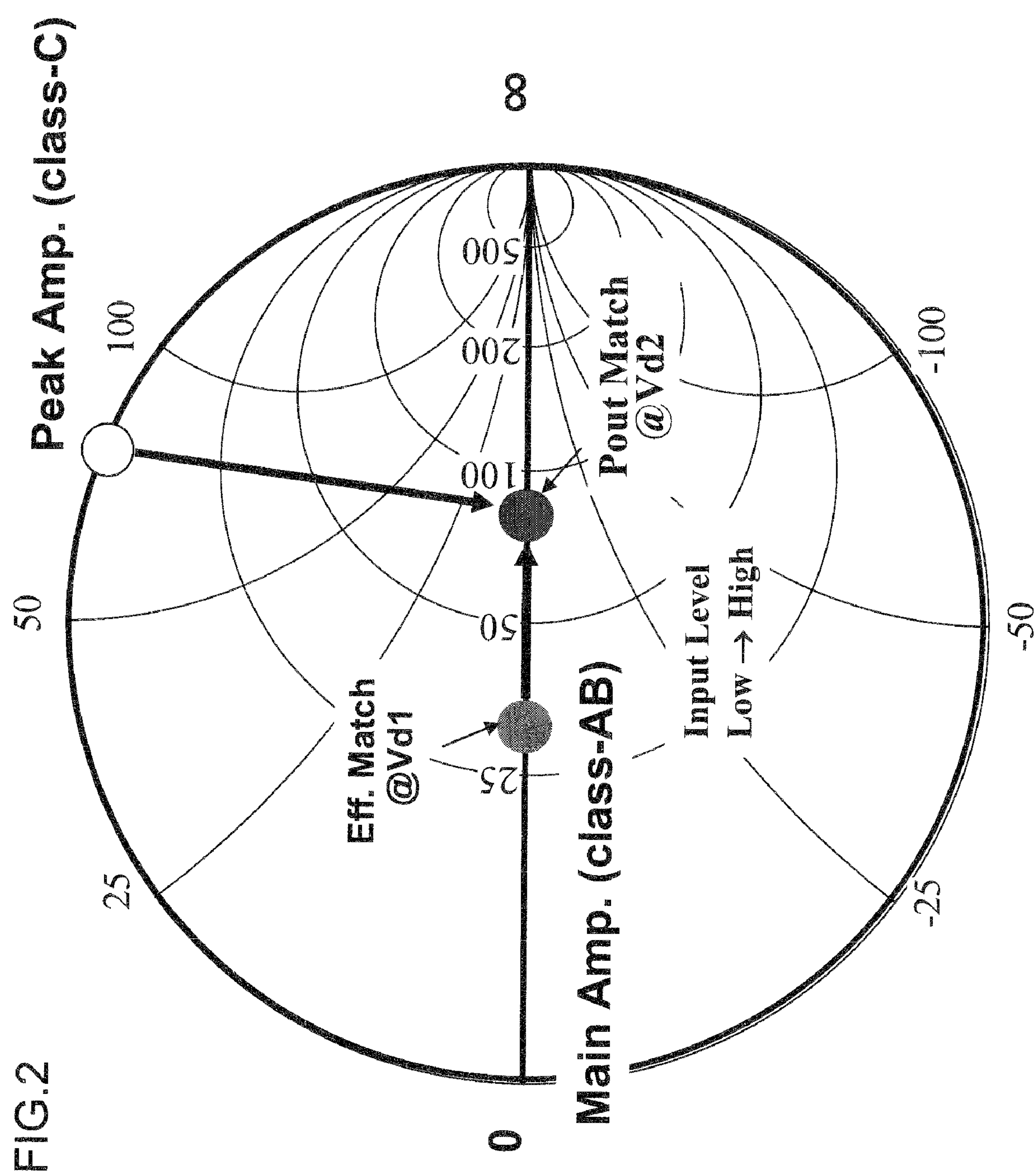
FIG. 2 is a diagram showing load variations of a main amplifier and a peak amplifier in the power amplifier of the Example of the present invention.

FIG. 2 shows the manner of a load variations of transistors of the main and peak amplifiers brought about by increase in the input signal level.

The load impedance of the main amplifier of the present Example is changed, with the increase of the input level, from the low impedance state to the high impedance state. In the low impedance state, the maximum efficiency for the low voltage may be obtained, whereas, in the high impedance state, the maximum output for the high voltage may be obtained.

Figure 3:
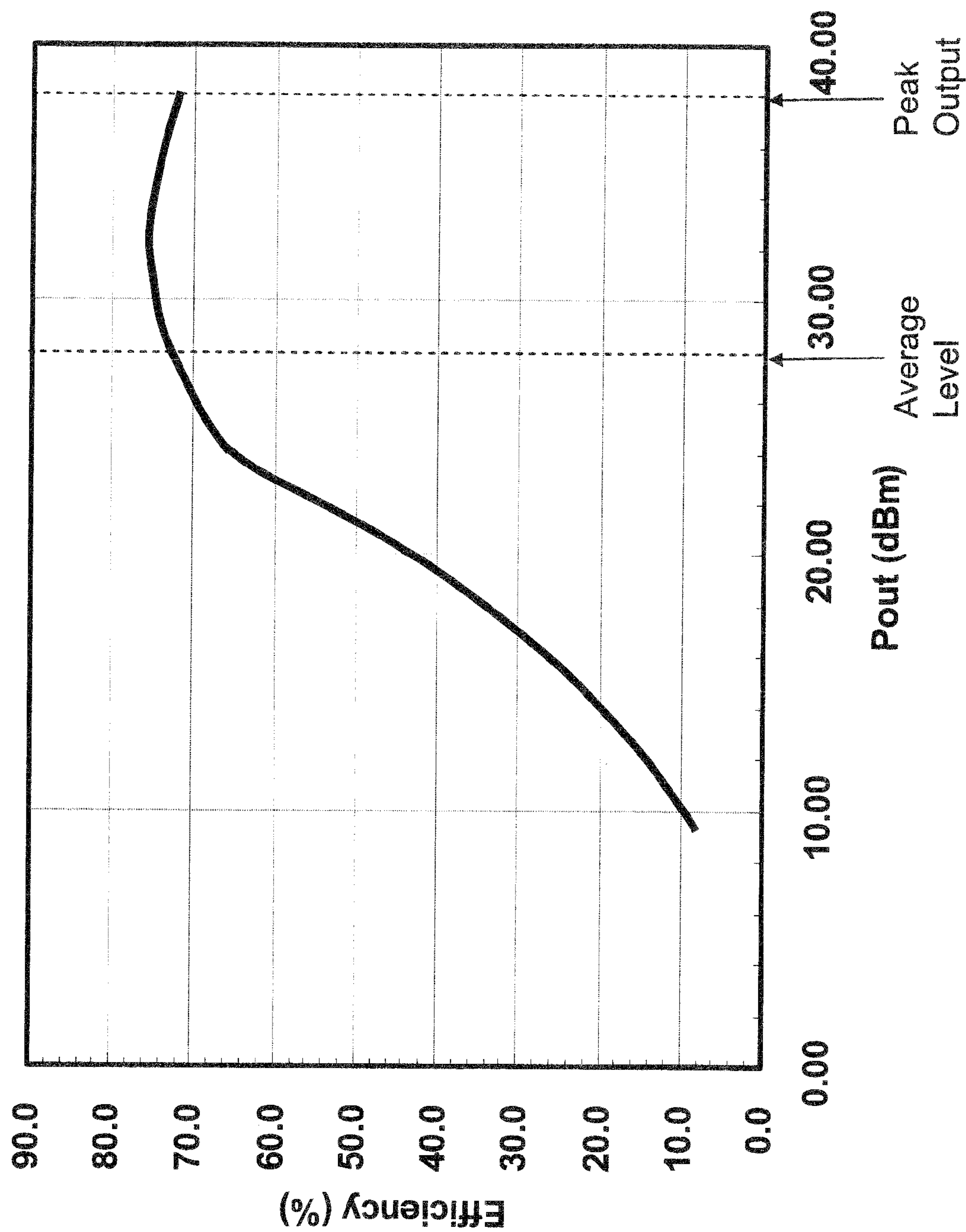
FIG. 3 is a graph showing an output-efficiency characteristic in the power amplifier of the Example of the present invention.
Figure 4:
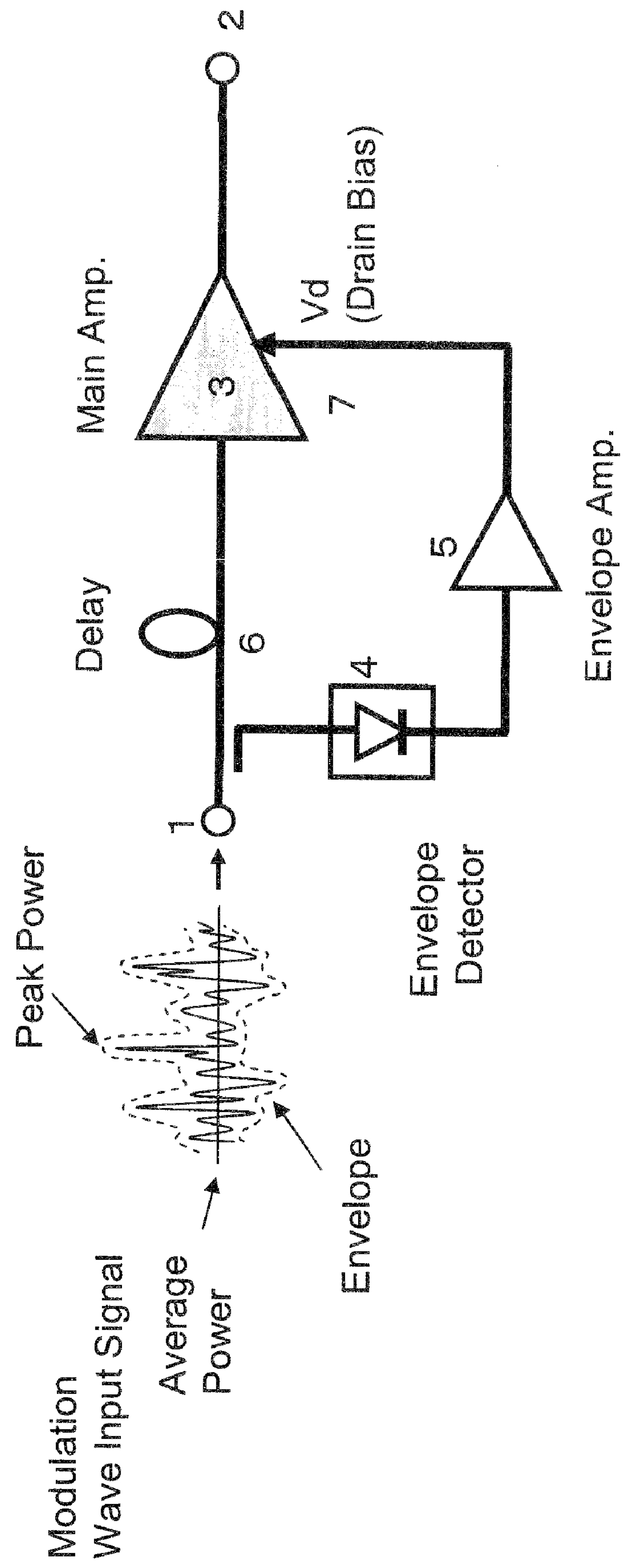
FIG. 4 is a circuit diagram showing a configuration of a drain-bias modulation amplifier of Non-Patent Document 1.
Figure 9:
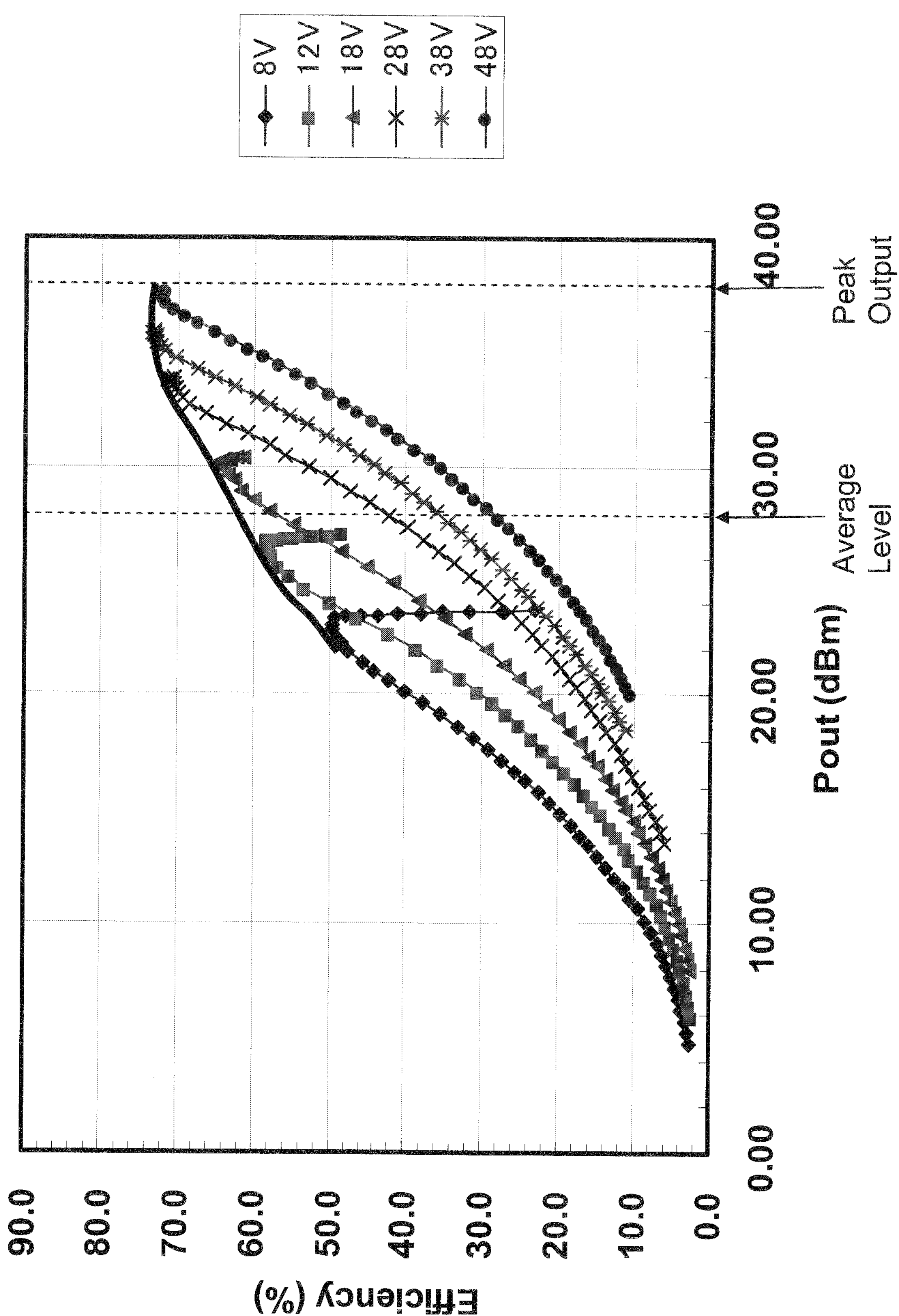
FIG. 9 is a graph showing drain voltage dependence of the output-efficiency characteristic in case of fixation to optimum load impedance for a high drain voltage.
Figure 10:
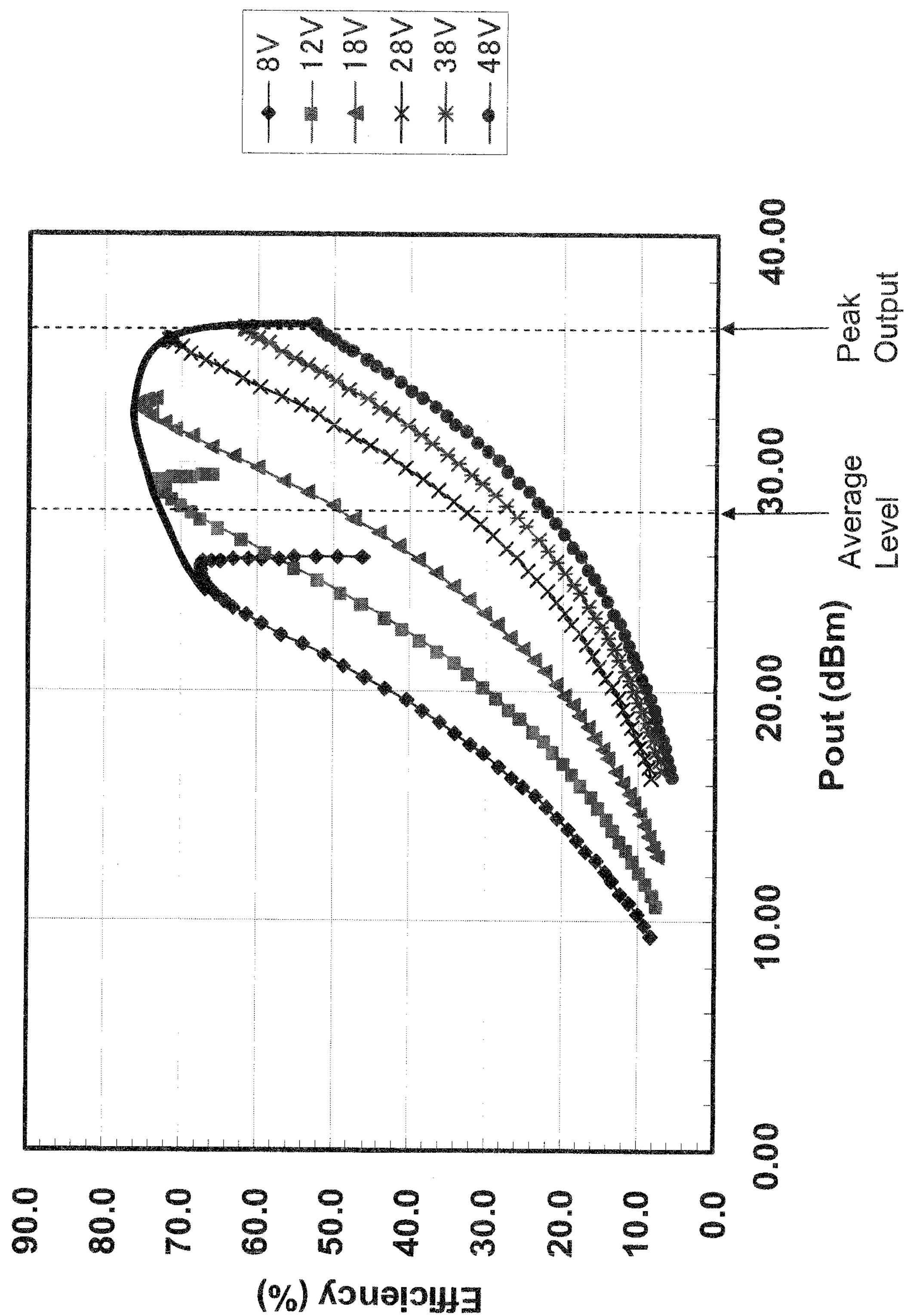
FIG. 10 is a graph showing drain voltage dependence of the output-efficiency characteristic in case of fixation to optimum load impedance for a low drain voltage.
Figure 11:
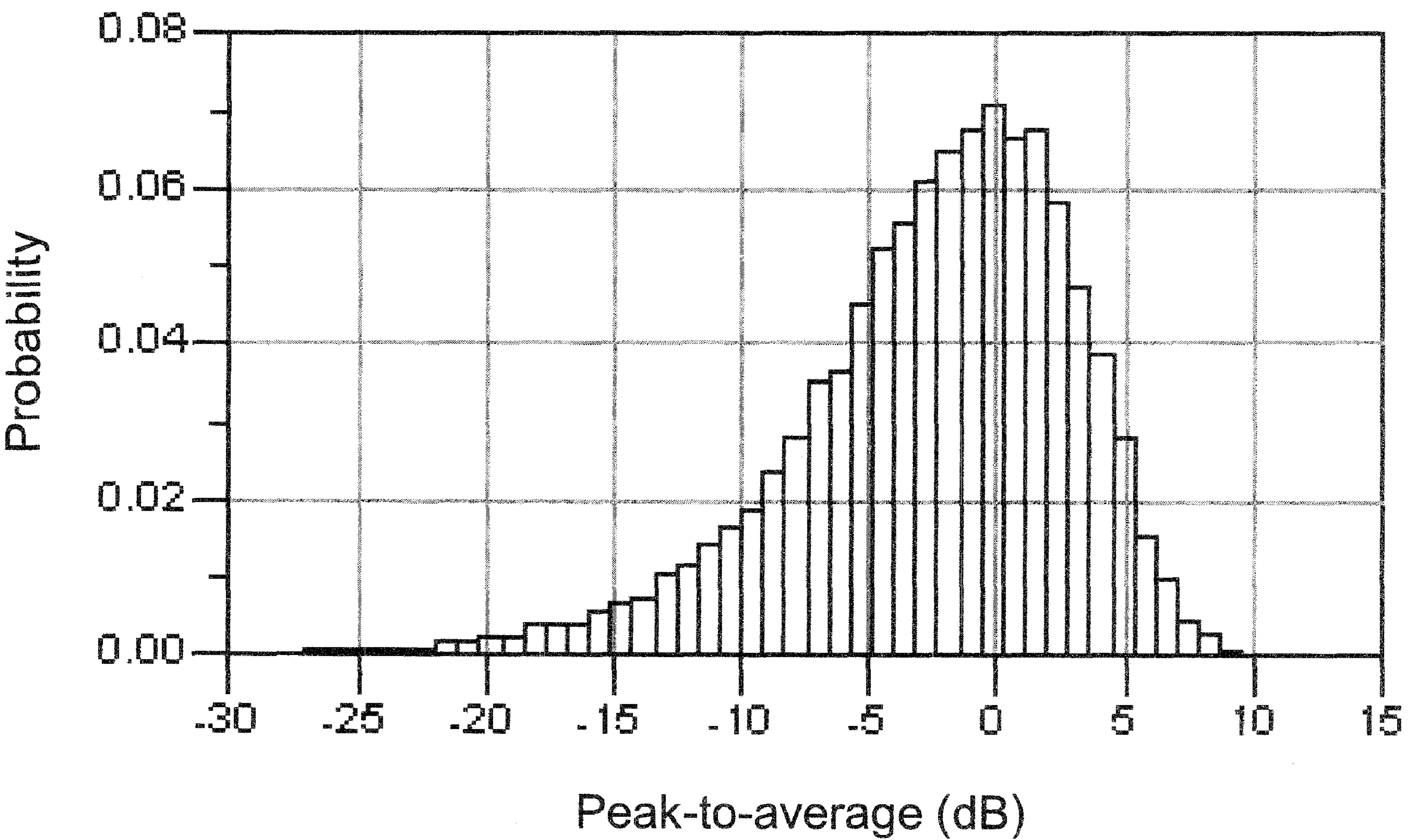
FIG. 11 is a graph showing probability distribution of an average power to peak power ratio of a W-CDMA modulation wave signal.
Figure 12:
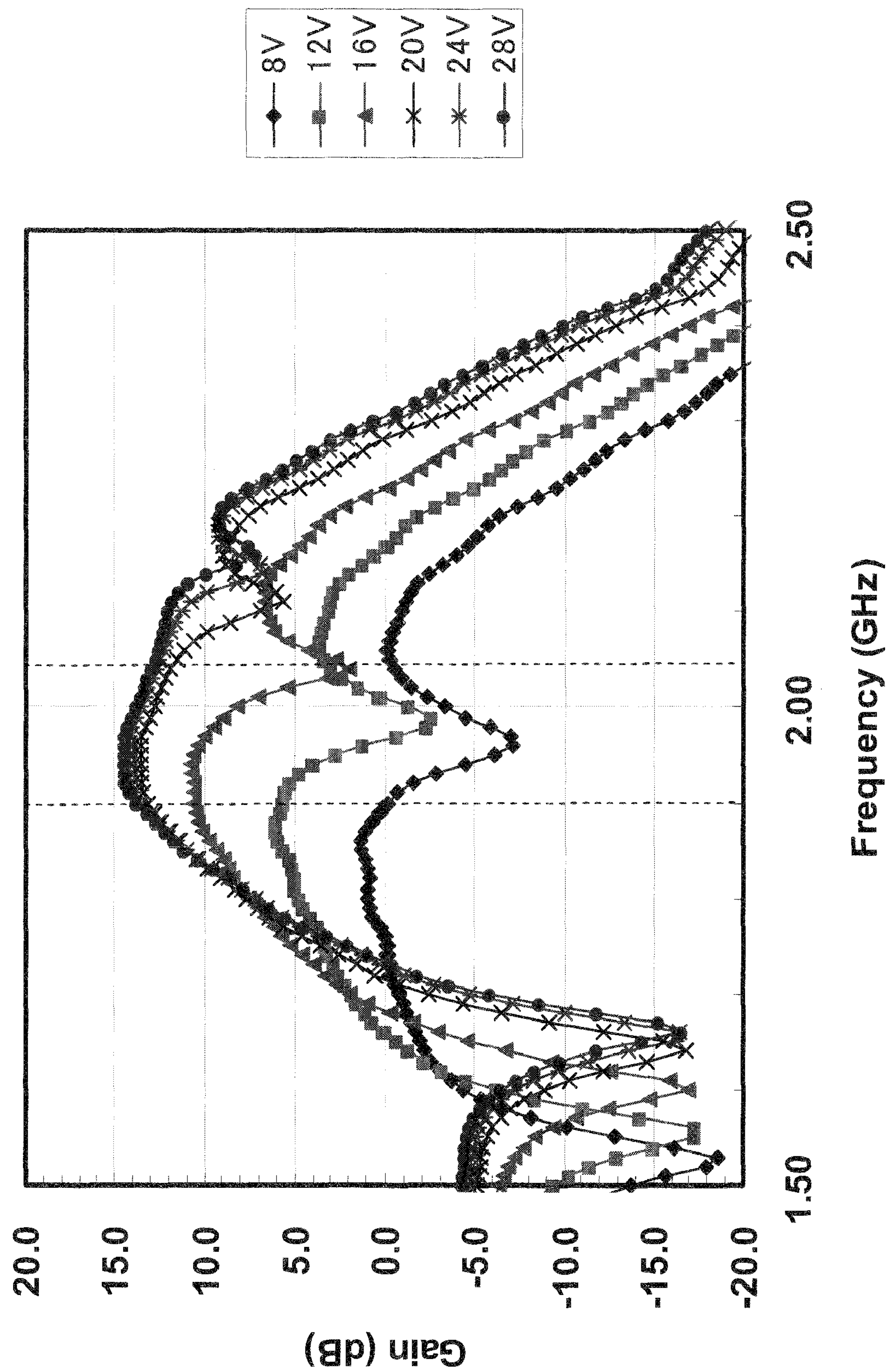
FIG. 12 is a graph showing a gain-frequency characteristic in case of changing drain voltages of the main amplifier and the peak amplifier in a conventional Doherty amplifier.

FIG. 3 shows an output-efficiency characteristic in the amplifier of the present Example. Comparison of the characteristic of the present Example to that of the amplifier of the related art technique, shown in FIGS. 9 and 10, reveals that, with the amplifier of the present Example, a peak output of 38 dBm may be obtained, while the average output level (28 dBm) at a back-off of approximately 10 dB is high and 73%, as shown in FIG. 3, thus achieving a high efficiency characteristic.

This may be due to the drain-bias circuit 7 connected to the main amplifier 3 and the impedance transforming action of the quarter-wave length transmission line 9 connected to the output of the peak amplifier 8. Specifically, the load impedance is changed in such a manner that, at an average output level, when the peak amplifier is OFF, the main amplifier 3 is operated in a low voltage state under a low impedance condition in which the maximum efficiency is obtained at a low voltage. At a peak output, when the peak amplifier 8 is ON, the main amplifier 3 is operated in a high voltage state under a high impedance condition in which the maximum output is obtained at the high voltage.

Also, since the bias of the peak amplifier 8 is fixed, the gain characteristic is not affected by the impedance of the peak amplifier 8.

Thus, with the amplifier of the amplifier of the present invention, even if the drain voltage is increased with increase in the input signal level, the high efficiency characteristic and the high peak characteristic may be achieved in combination at the operating point level. The reason is that the tendency towards the drain voltage dependence of the optimum load impedance of the device is keeping with the amplifier operation.

The disclosures of the aforementioned Non-Patent Documents 1 and 2 and Patent Document 3 are incorporated by reference herein. The particular examples may be modified or adjusted within the gamut of the entire disclosure of the present invention, inclusive of claims, based on the fundamental technical concept of the invention. Further, variegated combinations or selections of the elements disclosed herein may be made within the framework of the claims. That is, the present invention may encompass various modifications or corrections that may occur to those skilled in the art within the gamut of the entire disclosure of the present invention, inclusive of claim and the technical concept of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A power amplifier comprising:

a main amplifier;

a peak amplifier having a fixed bias; and a quarter-wave length transmission line connected to an output of the peak amplifier, the quarter-wave length transmission line having a length equal to one-fourth of the wave-length of a fundamental frequency;

the main amplifier including a drain bias circuit, the drain-bias circuit including:

an envelope detector that receives a modulation wave input signal to detect an envelope thereof; and an envelope amplifier that modulates a drain bias of the main amplifier in accordance with the envelope of the modulation wave input signal.

2. A power amplifier comprising:

a main amplifier;

a peak amplifier having a fixed bias;

an input distributor that distributes the power of a modulation wave input signal to the main amplifier and to the peak amplifier;

a quarter-wave length transmission line connected to an output of the peak amplifier, the quarter-wave length transmission line having a length equal to one-fourth of the wave-length of a fundamental frequency; and a bias circuit that supplies a bias voltage to the main amplifier, the bias circuit including:

an envelope detection circuit that receives the modulation wave input signal to detect an envelope thereof; and an envelope amplifier that amplifies an output of the envelope detection circuit and supplies a bias voltage to the main amplifier;

an output of the quarter-wave length transmission line and an output of the main amplifier being coupled together to produce an output signal.

3. The power amplifier according to claim 1, wherein the main amplifier is biased for class AB, and the peak amplifier is biased for class C.

4. The power amplifier according to claim 2, wherein the main amplifier is biased for class AB, and the peak amplifier is biased for class C.

5. The power amplifier according to claim 1, wherein the peak amplifier has a constant drain voltage and is turned on only at a peak power level of the modulation wave input signal to amplify the modulation wave input signal, and wherein the main amplifier is operated with a low voltage at an average level of the modulation wave input signal and is operated with a high voltage at an instantaneous peak level of the modulation wave input signal.

6. The power amplifier according to claim 2, wherein the peak amplifier has a constant drain voltage and is turned on only at a peak power level of the modulation wave input signal to amplify the modulation wave input signal, and wherein the main amplifier is operated with a low voltage at an average level of the modulation wave input signal and is operated with a high voltage at an instantaneous peak level of the modulation wave input signal.

7. The power according to claim 1, wherein the main amplifier allows for a load variation from a low impedance condition to a high impedance condition, by the impedance transforming action of the quarter-wave length transmission line, as the input level increases;

the low impedance condition being an impedance condition which affords the maximum efficiency for the low voltage operation at an average level of the modulation wave input signal, the high impedance condition being an impedance condition which affords the maximum output for the high voltage operation at a peak output.

8. The power according to claim 2, wherein the main amplifier allows for a load variation from a low impedance condition to a high impedance condition, by the impedance transforming action of the quarter-wave length transmission line, as the input level increases;

the low impedance condition being an impedance condition which affords the maximum efficiency for the low voltage operation at an average level of the modulation wave input signal, the high impedance condition being an impedance condition which affords the maximum output for the high voltage operation at a peak output.

* * * * *